United States Patent
Prajuckamol et al.

(10) Patent No.: US 10,607,921 B2
(45) Date of Patent: Mar. 31, 2020

(54) METHOD FOR FORMING A SEMICONDUCTOR PACKAGE

(71) Applicant: SEMICONDUCTOR COMPONENTS INDUSTRIES, LLC, Phoenix, AZ (US)

(72) Inventors: Atapol Prajuckamol, Klaeng (TH); Soon Wei Wang, Seremban (MY); Hoe Kit Liew How Kat Ley, Bukit Jalil (MY)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/206,057

(22) Filed: Nov. 30, 2018

(65) Prior Publication Data

US 2019/0103338 A1    Apr. 4, 2019

Related U.S. Application Data

(62) Division of application No. 15/724,413, filed on Oct. 4, 2017, now Pat. No. 10,177,074.

(51) Int. Cl.
*H01L 23/495* (2006.01)
*H01L 23/433* (2006.01)
(Continued)

(52) U.S. Cl.
CPC ........ *H01L 23/4334* (2013.01); *H01L 21/568* (2013.01); *H01L 23/4951* (2013.01); *H01L 23/4952* (2013.01); *H01L 23/4985* (2013.01); *H01L 23/49531* (2013.01); *H01L 23/49575* (2013.01); *H01L 24/01* (2013.01); *H01L 24/03* (2013.01); *H01L 24/05* (2013.01); *H01L 21/561* (2013.01); *H01L 23/3107* (2013.01); *H01L 24/02* (2013.01); *H01L 24/11* (2013.01); *H01L 24/13* (2013.01); *H01L 2224/02319* (2013.01); *H01L 2224/02335* (2013.01); *H01L 2224/02371* (2013.01); *H01L 2224/02381* (2013.01); *H01L 2224/0401* (2013.01); *H01L 2224/04105* (2013.01); *H01L 2224/05548* (2013.01); *H01L 2224/05644* (2013.01); *H01L 2224/05647* (2013.01); *H01L 2224/05655* (2013.01); *H01L 2224/1132* (2013.01); *H01L 2224/11849* (2013.01); *H01L 2224/12105* (2013.01);
(Continued)

(58) Field of Classification Search
CPC ............. H01L 23/49; H01L 23/4951; H01L 23/49531; H01L 23/49575; H01L 23/4985
See application file for complete search history.

(56) References Cited

U.S. PATENT DOCUMENTS 6,667,543 B1  12/2003  Chow
7,115,986 B2  10/2006  Moon
(Continued)

*Primary Examiner* — Phuc T Dang
(74) *Attorney, Agent, or Firm* — Adam R. Stephenson, Ltd.

(57) ABSTRACT

Implementations of semiconductor packages may include a die including a first side and a second side opposing the first side, the second side of the die coupled to a layer, a first end of a plurality of wires each bonded to the first side of the die, a mold compound encapsulating the die and the plurality of wires, and a second end of the plurality of wires each directly bonded to one of a plurality of bumps, wherein a surface of the layer is exposed through the mold compound.

18 Claims, 4 Drawing Sheets

(51) Int. Cl.
*H01L 23/498* (2006.01)
*H01L 23/00* (2006.01)
*H01L 21/56* (2006.01)
*H01L 23/31* (2006.01)

(52) U.S. Cl.
CPC .............. *H01L 2224/16225* (2013.01); *H01L 2224/73204* (2013.01); *H01L 2224/73253* (2013.01); *H01L 2224/85005* (2013.01); *H01L 2224/96* (2013.01); *H01L 2225/06517* (2013.01); *H01L 2924/18165* (2013.01)

(56) References Cited

U.S. PATENT DOCUMENTS

| | | | |
|---|---|---|---|
| 9,673,121 B2* | 6/2017 | Corisis | H01L 21/568 |
| 2002/0027265 A1* | 3/2002 | Yoneda | H01L 21/4832 |
| | | | 257/666 |
| 2002/0105069 A1 | 8/2002 | Kawahara | |
| 2003/0030132 A1* | 2/2003 | Lee | H01L 21/561 |
| | | | 257/678 |
| 2003/0173656 A1 | 9/2003 | Makimoto | |
| 2006/0121647 A1 | 6/2006 | Lin | |
| 2007/0196979 A1 | 8/2007 | Tan | |
| 2008/0099899 A1 | 5/2008 | Wang | |
| 2010/0059884 A1* | 3/2010 | Kuan | H01L 21/568 |
| | | | 257/738 |
| 2011/0156252 A1* | 6/2011 | Lin | H01L 21/568 |
| | | | 257/738 |
| 2016/0322326 A1 | 11/2016 | Katkar | |

\* cited by examiner

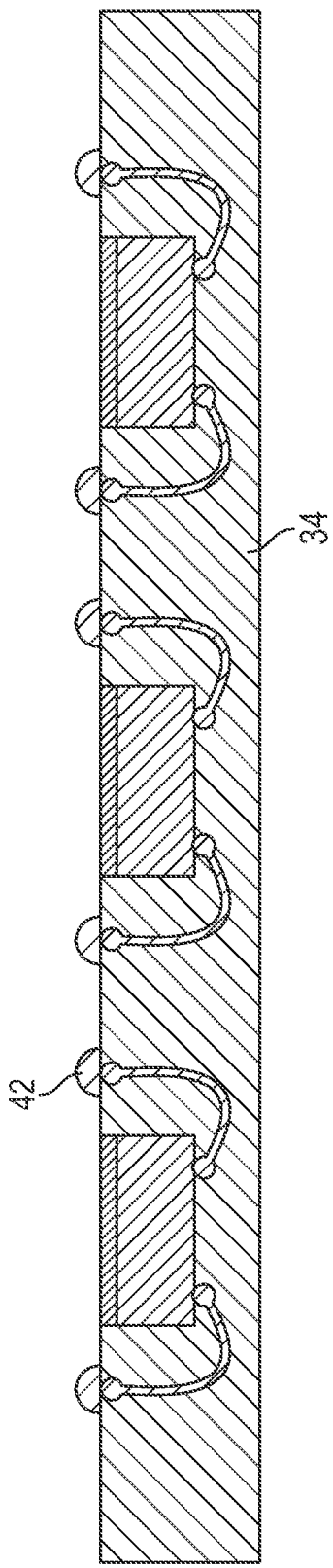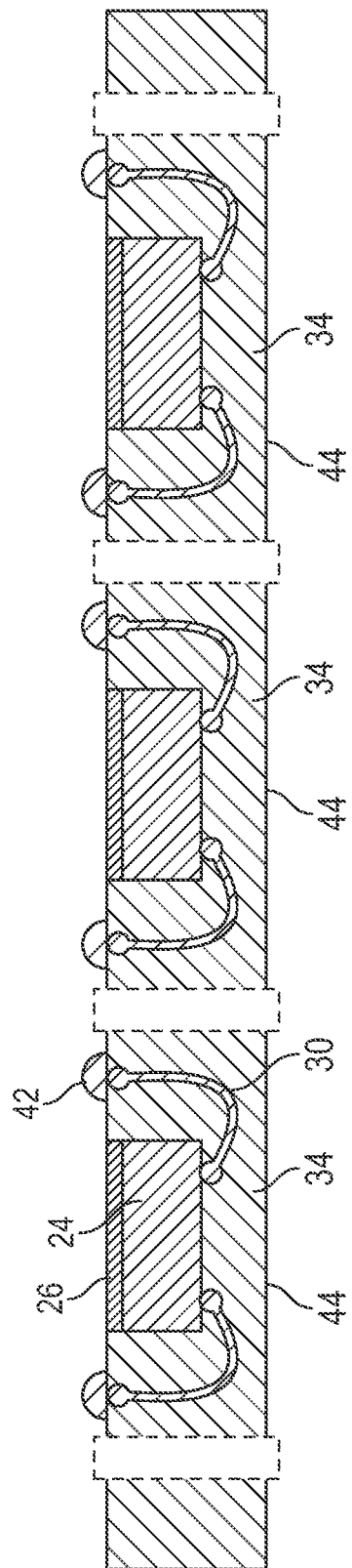

ns, a first end of a plurality of wires each bonded to the first side of the die, a mold compound encapsulating the die and the plurality of wires, and a second end of the plurality of wires each

METHOD FOR FORMING A SEMICONDUCTOR PACKAGE

CROSS REFERENCE TO RELATED APPLICATIONS

This application is a divisional application of the earlier U.S. Utility patent application to Prajuckamol entitled "Flexible Semiconductor Package and Related Methods," application Ser. No. 15/724,413, filed Oct. 4, 2017, now issued as U.S. Pat. No. 10,177,074, the disclosure of which is hereby incorporated entirely herein by reference.

BACKGROUND

1. Technical Field

Aspects of this document relate generally to semiconductor packages, such as leadless semiconductor packages. More specific implementations involve flexible semiconductor packages.

2. Background

Conventionally, integrated circuits are connected to a substrate or a lead frame. The substrate or lead frame is designed with a specific pitch or distance between electrical terminals to enable the integrated circuit to electrically couple to the substrate or lead frame. The substrate or lead frame may be encapsulated together with portions of the integrated circuit to form a semiconductor package.

SUMMARY

Implementations of semiconductor packages may include a die including a first side and a second side opposing the first side, the second side of the die coupled to a layer, a first end of a plurality of wires each bonded to the first side of the die, a mold compound encapsulating the die and the plurality of wires, and a second end of the plurality of wires each directly bonded to one of a plurality of bumps, wherein a surface of the layer is exposed through the mold compound.

Implementations of semiconductor packages may include one, all, or any of the following:

The layer may be a die flag.
The layer may be a non-electrically conductive layer.
The layer may be an electrically conductive layer.
The package may not include a lead frame.
Five faces of the package may be entirely covered by the mold compound.

Implementations of a method of forming a semiconductor package may include coupling a plurality of die to a metal sheet, each die including a non-electrically conductive layer between the die and the metal sheet, bonding a plurality of wires to a first side of each die opposing the non-electrically conductive layer, bonding the plurality of wires to the metal sheet, and applying a mold compound over each die and the plurality of wires. The method may also include exposing an end of each wire of the plurality of wires through removing the metal sheet, forming a solder pad over each exposed end of each wire, reflowing the solder pad to form a bump over each exposed end of each wire, and singulating the mold compound to form a plurality of semiconductor packages.

Implementations of methods of forming semiconductor packages may include one, all, or any of the following:

Removing the metal sheet may include peeling away the metal sheet.

Forming a solder pad over each exposed end of each wire may include printing a solder pad.

The non-electrically conductive layer may be a die flag.

The package may not include a lead frame.

Implementations of a method of forming a semiconductor package may include coupling a plurality of die to a metal sheet, each die including a wafer backside coating between the die and the metal sheet, bonding a plurality of wires to a first side of each die opposing the wafer backside coating and bonding the plurality of wires to the metal sheet, and applying a mold compound over each die and the plurality of wires. The method may also include exposing an end of each wire of the plurality of wires by peeling away the metal sheet, forming and patterning a photoresist layer over the mold compound and over the wafer backside coating, forming an electrically conductive layer over each exposed end of each wire, removing the photoresist layer, and singulating the mold compound to form a plurality of semiconductor packages.

Implementations of methods of forming semiconductor packages may include one, all, or any of the following:

The method may include coupling a plurality of die flags to the plurality of die.

The method may include reflowing the solder layer to form a plurality of bumps electrically coupled to the die through the plurality of wires.

The package may not include a lead frame.

A surface of the wafer backside coating may be exposed through the mold compound.

Five faces of the package may be entirely covered by the mold compound.

Each wire may be reverse bonded to the first side of the die.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and:

FIGS. 2A-2F are a representation of a process of forming a semiconductor package;

DESCRIPTION

This disclosure, its aspects and implementations, are not limited to the specific components, assembly procedures or method elements disclosed herein. Many additional components, assembly procedures and/or method elements known in the art consistent with the intended semiconductor package will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor packages, and implementing components and methods, consistent with the intended operation and methods.

Figure 1:
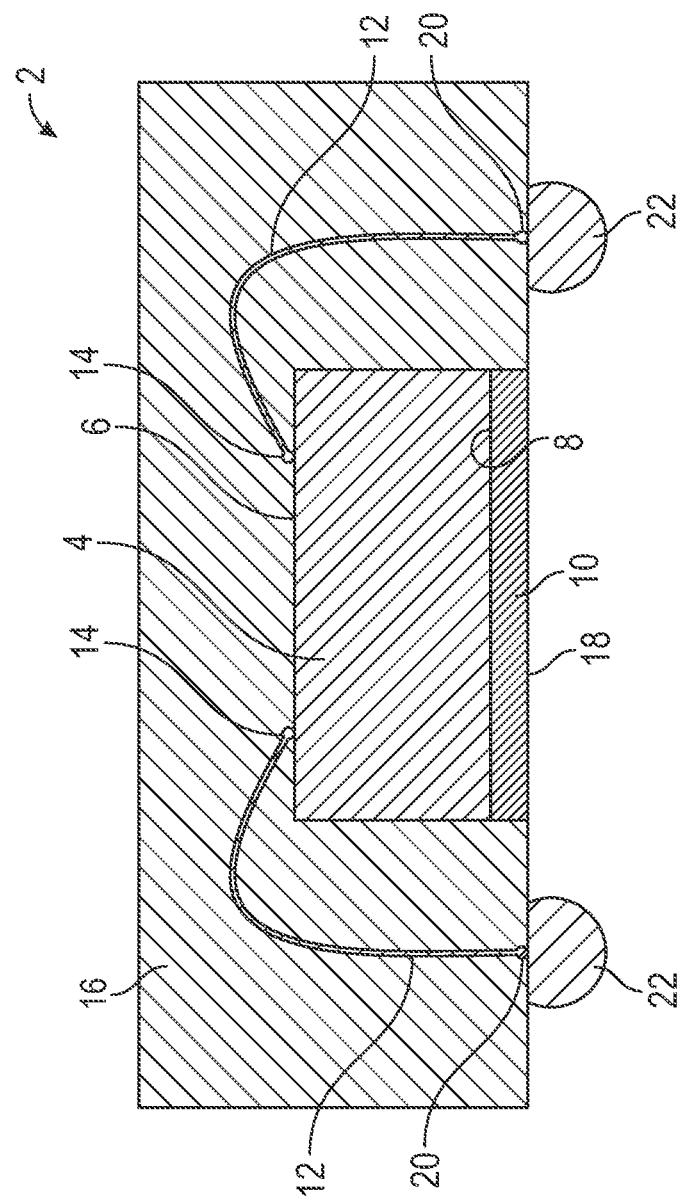
FIG. 1 is a cross sectional view of semiconductor package.

Referring to FIG. 1, a cross sectional view of a semiconductor package is illustrated. The semiconductor package 2 includes a die 4. The die 4 includes a first side 6 and a second side 8 opposing the first side 6. The semiconductor package may include a layer 10. In various implementations, the semiconductor package may include more than one layer as part of the layer 10. The layer 10 is coupled to the second side 8 of the die 4. The layer 10 may be either electrically conductive or electrically non-conductive. In various implementations, the layer 10 may have been part of a wafer backside coating (WBC) prior to the wafer being singulated into a plurality of die. In other implementations, the layer 10 may be a die flag, and in still other implementations, the layer 10 may be coupled to a die flag. The layer 10 may also include backside metal applied to the backside of the die in various implementations. The layer 10 may be the same width and length as the second side 8 of the die 4, however, in other implementations the layer may be more or less wide and more or less long than the second side of the die.

In various implementations, the semiconductor package 2 includes a plurality of wires 12. The wires may include, by non-limiting example, gold, copper, nickel, or any other electrically and/or thermally conductive material. In various implementations, the wires are 0.8 mm thick, while in other implementations the wire may be more or less thick than 0.8 mm. A first end 14 of each wire of the plurality of wires are coupled to the first side 6 of the die 4, and in various implementations, may be directly coupled to the first side 6 of the die 4. The wires 12 may be coupled to the die through a variety of methods, including, by non-limiting example, wirebonding, soldering, or other mechanisms for bonding metals together. In various implementations, the wires 12 may actually be clips which are preformed, or substantially preformed before being coupled directly to the first side 6 of the die 4.

The semiconductor package 2 includes a mold compound 16. The mold compound 16 may encapsulate the plurality of wires 12 and the die 4. The mold compound 16 may cover sides of the layer 10; however, in various implementations a face 18 of the layer 10 is exposed through the mold compound. In various implementations, five sides of the die 4 may be covered by the mold compound 16. The mold compound 16 may be, by non-limiting example, an epoxy mold compound, an acrylic molding compound, or another type of material capable of physically supporting the die and providing protection against ingress of contaminants into the package. The mold compound 16 may be flexible in various implementations.

The plurality of wires 12 extend through the mold compound 16 and a plurality of second ends 20 of the plurality of wires 12 may be exposed through, or not covered by, the mold compound 16. The second end of each wire may be coupled to an electrical contact 22. In various implementations, each electrical contact 22 may be part of an electrical layer. The electrical contact may by, by non-limiting example, a ball, a stud, a pad, a pin, or any other type of electrical contact. In various implementations, the electrical contact may be, by non-limiting example, solder, gold, tin, silver, or any other electrically/thermally conductive material.

As illustrated in FIG. 1, the semiconductor package 2 does not include a lead frame. Because there is no lead frame, the package foot print is defined by where the wires are bonded and not by the dimensions of a lead frame. Similarly, the position of the wires is not dictated by the structure of a lead frame. Furthermore, because there is no lead frame included in the semiconductor package, the package may be flexible in those portions that do not include the die.

Figure 2A:
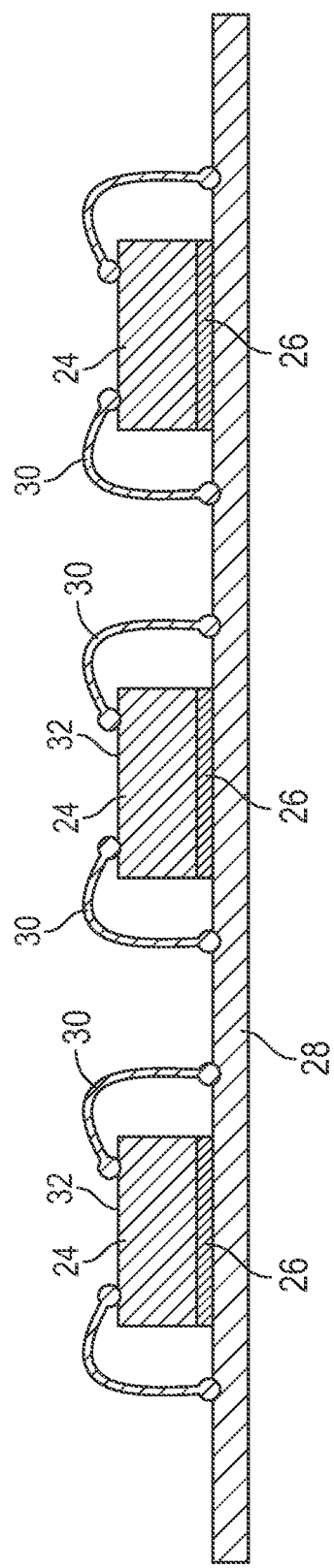
Figure 2B:
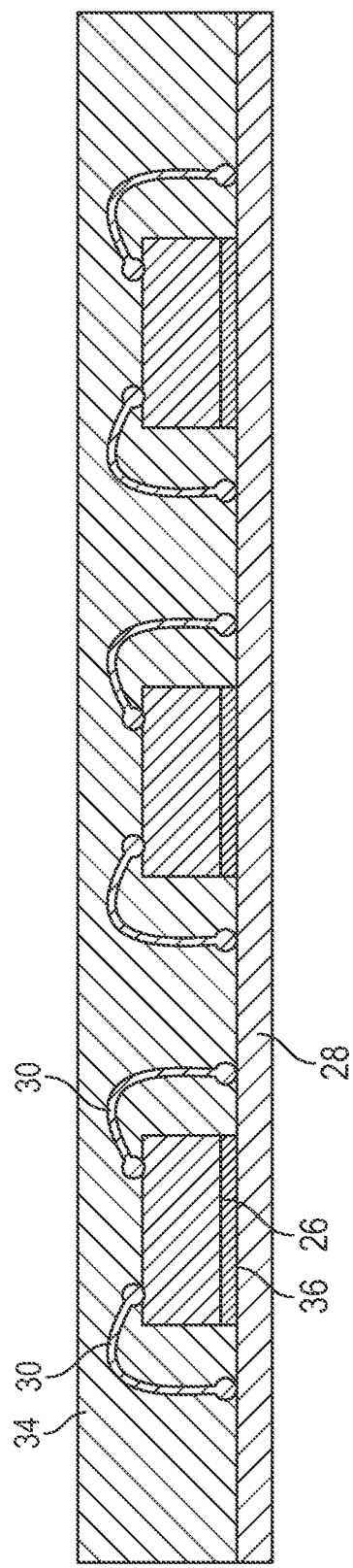

Referring to FIGS. 2A-2F, a representation of a process of forming a semiconductor package is illustrated. In various implementations, a method of forming a semiconductor package may include coating a side of a wafer with a WBC. The WBC may or may not be electrically conductive in various implementations. The wafer with the WBC is then singulated into a plurality of die 24, as shown in FIG. 2A. The layers 26 below each die 24 may be considered part of the die. In various implementations, the layers 26 are portions of the WBC, however, in other implementations, the layers 26 are not derived from the WBC. Each layer may or may not be electrically conductive. Each die may include two or more layers and in various implementations, each layer 26 may be a die flag. In other implementations, the die 24 may be coupled to die flags with the layer 26 in between the die flag and the remainder of the die 24.

Figure 2C:
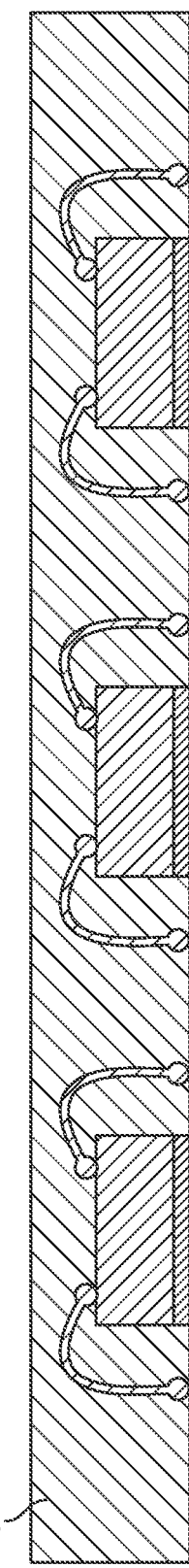
Figure 2D:
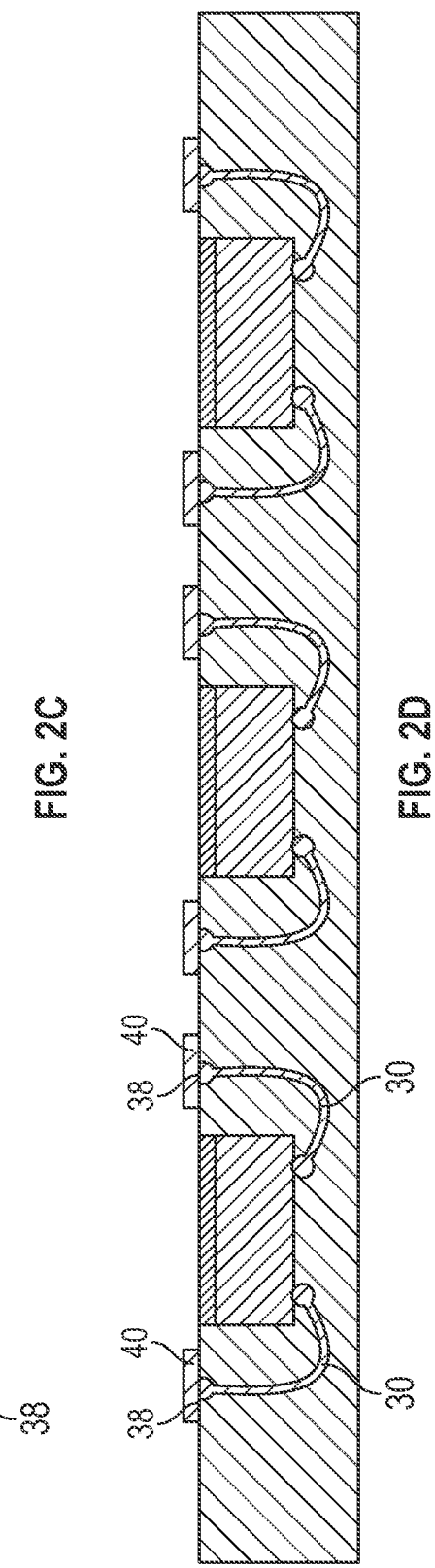
Figure 3:
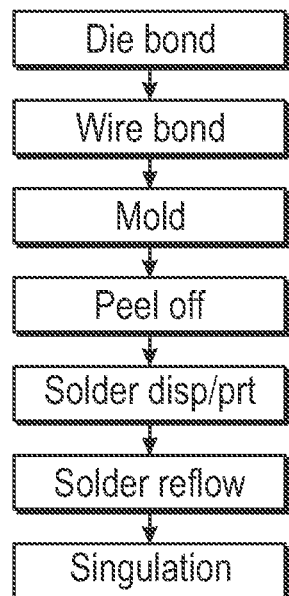
FIG. 3 is a process flow for forming a semiconductor package.

FIG. 3 shows a process flow for forming a semiconductor package. Referring to both FIG. 3 and FIGS. 2A-2F, the method for forming a semiconductor package includes coupling the plurality of die 24 to a surface 28. The plurality of layers 26 may be directly coupled to the surface 28 so that the layers 26 are between the surface 28 and the remainder of the die 24. In various implementations, the surface 28 may be a metal sheet. In such implementations, the metal sheet may be copper or any other metal or metal alloy. The metal sheet may be considered a bare lead frame as it is nothing more than a metal sheet void of any patterns.

Figure 4:
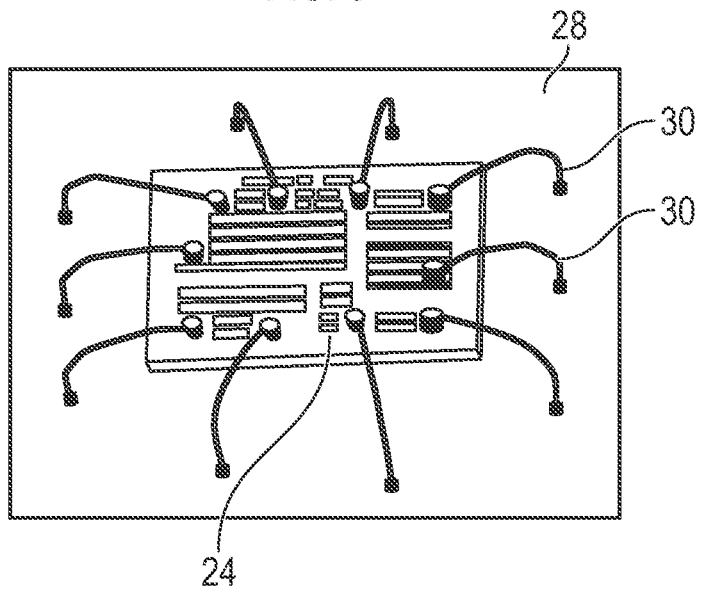
FIG. 4 is a top perspective view of a plurality of wires bonded to a die and a metal sheet.

A plurality of wires 30 may be bonded to a first side 32 of each die 24. The first side 32 of each die opposes the side of the die which includes the layer 26. The plurality of wires 30 are also bonded to the surface 28. Depending on the method used to bond the wires to the first side 32 of each die, the wires may be bonded to the surface 28 in the same operation, or through a separate processing step. The wires may be any type and any size of wire previously disclosed herein including a clip. In various implementations, the wires are reverse bonded to the die, or they are first bonded to the surface 28 and then to the die 24. In various implementations, the bond between the wire and the die may have a low ball shear. Referring to FIG. 4, a top perspective view of a plurality of wires bonded to a die and a metal sheet is shown. Any number of wires 30 may be bonded to each die 24 and they may be bonded to any desired position on the surface 28.

Referring back to FIG. 2B and FIG. 3, the method for forming a semiconductor package includes applying a mold compound 34 over each die 24 and the plurality of wires 30. In various implementations, the mold compound 34 may cover five sides of each die 24, while in other implementations the mold compound may cover more or fewer than five sides of each die. A surface 36 of each layer 26 may be exposed through, or not covered by, the mold compound 34. The mold compound 34 may be any type of mold compound previously disclosed herein, and may be flexible in various implementations. The mold compound 34 may be applied using, by non-limiting example, a liquid dispensing technique, a transfer molding technique, a printer molding technique, a film molding technique, a compression molding technique and any other technique for forming a solidified mold compound around the die and wires.

Figure 5:
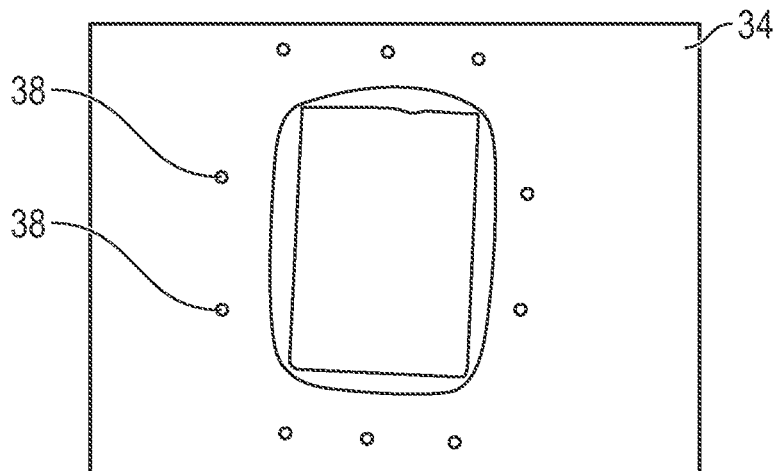
FIG. 5 is a bottom view of semiconductor package with wires exposed through a mold compound.

Referring to FIG. 2C and FIG. 3, the method for forming a semiconductor package includes exposing an end 38 of each wire 30 by removing the surface 28. In various implementations, the surface 28 may be peeled away and may be done so by hand. In other implementations, the peeling away may be done through an automated process. In other implementations, the surface 28 may be removed through etching, grinding, or another subtractive process. Referring to FIG. 5, a bottom view of a semiconductor package with wires exposed through the mold compound is shown. The ends 38 of the wires may be flush or substantially flush with the mold compound 34.

Referring to FIGS. 2D-2E and FIG. 3, implementations of a method for forming a semiconductor package include forming a plurality of electrical contacts 40 over each exposed end 38 of each wire 30. In various implementations, a solder pad may be formed over each exposed end 38 of each wire. The solder pad may be formed by being printed over each exposed end of each wire. The solder pad may then be reflowed to form a solder bump. In other implementations, after the surface 28 is removed, a photoresist layer may be formed over the mold compound, layer 26, and exposed ends 38 of the wires 30. The photoresist layer may be patterned to again expose the ends 38 of the wires 30. An electrically conductive layer may be formed over each exposed end of each wire and the photoresist layer may then be removed. The electrically conductive layer may include bumps, studs, pins, or any other type of electrical contact.

Following forming the electrical contacts over each exposed end 38 of the wires 30, the mold compound 34 encasing the plurality of die may be cut through to form a plurality of semiconductor packages 44. The plurality of semiconductor packages may be singulated using, by non-limiting example, a saw, a laser, a waterjet, plasma etching, deep reactive-ion etching, or chemical etching. The semiconductor packages may be singulated in a manner that the entire die 24 and the plurality of wires 30 is fully encased by the mold compound 34, any layers, and any electrical contacts 42.

No lead frame is included in the semiconductor package. Because of this, semiconductor packages for new die technology that require a new package footprint can quickly be developed as there is no need to work to design and produce a lead frame with a specific structure. The lead frame development time may essentially be eliminated. A bare lead frame, often times a metal sheet, can be used in place of a lead frame with a specific structure. It further allows for the same bare lead frame to be used with a variety of packages as the wires may be bonded to any position on the bare lead frame.

In places where the description above refers to particular implementations of semiconductor packages and implementing components, sub-components, methods and sub-methods, it should be readily apparent that a number of modifications may be made without departing from the spirit thereof and that these implementations, implementing components, sub-components, methods and sub-methods may be applied to other semiconductor packages.

What is claimed is:

1. A method of forming a semiconductor package comprising:
    coupling a plurality of die to a non-electrically conductive layer;
    coupling the non-electrically conductive layer to a metal sheet;
    bonding a plurality of wires to a first side of each die;
    bonding the plurality of wires to the metal sheet;
    applying a mold compound over each die and the plurality of wires;
    exposing an end of each wire of the plurality of wires and the non-electrically conductive layer through peeling off the metal sheet; and
    singulating the mold compound to form a plurality of semiconductor packages;
    wherein each semiconductor package of the plurality of semiconductor packages comprises a portion of the non-electrically conductive layer.

2. The method of claim 1, wherein singulating the mold compound comprises sawing through the mold compound.

3. The method of claim 1, further comprising coupling an electrical contact to each exposed end of each wire.

4. The method of claim 3, wherein an electrical contact comprises one of a bump, a stud, or a pad.

5. The method of claim 1, wherein the semiconductor package does not comprise a lead frame.

6. A method of forming a semiconductor package comprising:
    coupling a plurality of die to a metal sheet, each die coupled to a non-electrically conductive layer between the die and the metal sheet;
    bonding a plurality of wires to a first side of each die opposing the non-electrically conductive layer and bonding the plurality of wires to the metal sheet;
    applying a mold compound over each die and the plurality of wires;
    exposing an end of each wire of the plurality of wires through removing the metal sheet; and
    singulating the mold compound to form a plurality of semiconductor packages;
    wherein the non-electrically conductive layer comprised in each semiconductor package of the plurality of semiconductor packages is exposed through the mold compound.

7. The method of claim 6, wherein removing the metal sheet comprises peeling away the metal sheet.

8. The method of claim 6, further comprising forming a solder pad over each exposed end of each wire.

9. The method of claim 8, wherein forming a solder pad over each exposed end of each wire comprises printing a solder pad.

10. The method of claim 6, wherein the non-electrically conductive layer is a die flag.

11. The method of claim 6, wherein the semiconductor package does not comprise a lead frame.

12. A method of forming a semiconductor package comprising:
    coupling a plurality of die to a metal sheet, each die comprising a wafer backside coating between the die and the metal sheet;
    bonding a plurality of wires to a first side of each die opposing the wafer backside coating and bonding the plurality of wires to the metal sheet;
    applying a mold compound over each die and the plurality of wires;
    exposing an end of each wire of the plurality of wires by peeling away the metal sheet;
    forming and patterning a photoresist layer over the mold compound and over the wafer backside coating;
    forming an electrically conductive layer over each exposed end of each wire;
    removing the photoresist layer; and
    singulating the mold compound to form a plurality of semiconductor packages.

13. The method of claim 12, further comprising coupling a plurality of die flags to the plurality of die.

14. The method of claim 12, further comprising reflowing the electrically conductive layer to form a plurality of bumps electrically coupled to the die through the plurality of wires.

15. The method of claim 12, wherein the semiconductor package does not comprise a lead frame.

16. The method of claim 12, wherein a surface of the wafer backside coating is exposed through the mold compound.

17. The method of claim 12, wherein five faces of the semiconductor package are entirely covered by the mold compound.

18. The method of claim 12, wherein each wire is reverse bonded to the first side of the die.

* * * * *